(12) United States Patent
Pisello et al.

(10) Patent No.: US 11,486,928 B2
(45) Date of Patent: Nov. 1, 2022

(54) ELECTRONIC CIRCUIT AND CORRESPONDING METHOD OF TESTING ELECTRONIC CIRCUITS

(71) Applicants: STMicroelectronics S.r.l., Agrate Brianza (IT); STMicroelectronics (Shenzhen) R&D Co. Ltd, Nanshan (CN)

(72) Inventors: Ignazio Pisello, Tremestrieri Etneo (IT); Yu Yong Wang, GuangDong (CN); Dario Arena, Messina (IT); Qi Yu Liu, Nanshan (CN)

(73) Assignees: STMicroelectronics S.r.l., Ag rate Brianza (IT); STMicroelectronics (Shenzhen) R&D Co. Ltd, Shenzhen (CN)

( * ) Notice: Subject to any disclaimer, the term of this patent is extended or adjusted under 35 U.S.C. 154(b) by 16 days.

(21) Appl. No.: 17/159,511

(22) Filed: Jan. 27, 2021

(65) Prior Publication Data
US 2021/0232174 A1    Jul. 29, 2021

(30) Foreign Application Priority Data

Jan. 28, 2020  (IT) .......................... 102020000001636

(51) Int. Cl.
*G01R 31/3185* (2006.01)
*G01R 31/317* (2006.01)
*G06F 1/06* (2006.01)

(52) U.S. Cl.
CPC ................ *G01R 31/318533* (2013.01); *G01R 31/318536* (2013.01); *G01R 31/318538* (2013.01);
(Continued)

(58) Field of Classification Search
CPC .... G01R 31/318533; G01R 31/318536; G01R 31/318538; G01R 31/318541;
(Continued)

(56) References Cited

U.S. PATENT DOCUMENTS

| 4,931,722 A | * | 6/1990 | Stoica | ............ G01R 31/318561 |
| | | | | 714/733 |
| 9,599,672 B2 | * | 3/2017 | Abhishek | ....... G01R 31/318552 |

(Continued)

OTHER PUBLICATIONS

H. Kim, J. Chung, J. A. Abraham, E. Byun and C. Woo, "A Built-In Self-Test scheme for high speed I/O using cycle-by-cycle edge control," 2010 15th IEEE European Test Symposium, Prague, Czech Republic, 2010, pp. 145-150. (Year: 2010).*

(Continued)

*Primary Examiner* — Cynthia Britt
(74) *Attorney, Agent, or Firm* — Crowe & Dunlevy

(57) ABSTRACT

A combinational circuit block has input pins configured to receive input digital signals and output pins configured to provide output digital signals as a function of the input digital signals received. A test input pin receives a test input signal. A test output pin provides a test output signal as a function of the test input signal received. A set of scan registers are selectively coupled to either the combinational circuit block or to one another so as to form a scan chain of scan registers serially coupled between the test input pin and the test output pin. The scan registers in the set of scan registers are clocked by a clock signal. At least one input register is coupled between the test input pin and a first scan register of the scan chain. The at least one input register is clocked by an inverted replica of the clock signal.

13 Claims, 3 Drawing Sheets

(52) U.S. Cl.
    CPC .............. *G01R 31/318541* (2013.01); *G01R 31/318552* (2013.01); *G01R 31/318572* (2013.01); *G01R 31/31713* (2013.01); *G01R 31/31727* (2013.01); *G06F 1/06* (2013.01)

(58) Field of Classification Search
    CPC .... G01R 31/318552; G01R 31/318572; G01R 31/31713; G01R 31/31727; G06F 1/06
    See application file for complete search history.

(56) References Cited

U.S. PATENT DOCUMENTS

| | | | |
|---|---|---|---|
| 11,137,448 B2 * | 10/2021 | Whetsei | G01R 31/318536 |
| 2003/0097614 A1 | 5/2003 | Rajski et al. | |
| 2007/0101222 A1 * | 5/2007 | Chen | G01R 31/318541 714/727 |
| 2010/0153796 A1 * | 6/2010 | Rachapalli | G01R 31/318552 714/E11.155 |
| 2014/0047293 A1 | 2/2014 | Lamb et al. | |
| 2016/0169966 A1 | 6/2016 | Abshishek et al. | |

OTHER PUBLICATIONS

Seongmoon Wang et al: "Low Overhead Partial Enhanced Scan Technique for Compact and High Fault Coverage Transition Delay Test Patterns", Proceeding 13th IEEE European Test Symposium—ETS 2008—May 25-29, 2008, Verbania, Italy, IEEE, New York, NY, US, May 25, 2008, pp. 125-130, XP031281092.
IT Search Report and Written Opinion for IT Appl. No. 102020000001636 dated Oct. 12, 2020 (7 pages).

* cited by examiner

ELECTRONIC CIRCUIT AND CORRESPONDING METHOD OF TESTING ELECTRONIC CIRCUITS

PRIORITY CLAIM

This application claims the priority benefit of Italian Application for Patent No. 102020000001636, filed on Jan. 28, 2020, the content of which is hereby incorporated by reference in its entirety to the maximum extent allowable by law.

TECHNICAL FIELD

The description relates to testing of digital electronic circuits.

One or more embodiments may be applied to digital electronic circuits suitable for being tested by means of Automatic Test Pattern Generation (ATPG) methods.

BACKGROUND

Digital circuits may be employed for realizing logic functions, for example, in mixed-signal devices.

Such digital circuits may conventionally be tested by means of Automatic Test Pattern Generation (ATPG) methods, Transition Fault (TF) tests, and supply quiescent current (IDDQ) tests.

The target fault coverage of these tests may be determined depending on the application (for example, a high fault coverage may be desired for automotive-grade products).

In the case of ATPG test methods, reaching a desired fault coverage may involve injecting, at one or more test input pins of the circuit under test, one or more scan sequences which are rather long. The length of the scan sequence(s) may depend on the number of registers (for example, flip-flops) in the circuit under test. For instance, a scan test may rely on a scan sequence comprising 10 million values (bits) to be sequentially injected at one or more test input pins of the device under test (DUT).

Conventionally, the ATPG shift clock frequency of scan registers in a scan path may be set to a value lower than 20 MHz, for example, around 10 MHz. Therefore, execution of a scan test comprising an input sequence having 10 millions of values at 10 MHz may take around one second for completion.

Additionally, TF tests may also take around one second for execution, and IDDQ tests may take around 100 milliseconds for execution. As a result, the testing time of a single digital circuit in an electronic device (for example, a mixed-signal device for automotive use) may be longer than two seconds.

There is a need in the art to reduce the testing time of digital circuits.

SUMMARY

In an embodiment, a reduction in the testing time is facilitated by increasing the ATPG shift clock frequency ("scan frequency") of digital circuits. For instance, one or more embodiments may aim at performing ATPG tests (for example, scan tests) at a frequency of 40 MHz or more.

According to one or more embodiments, an electronic circuit (for example, a digital circuit) is provided.

One or more embodiments may relate to a corresponding method of testing an electronic circuit.

According to one or more embodiments, an electronic circuit is provided. As conventional in the art, the electronic circuit may comprise a combinational circuit block having a set of input pins configured to receive input digital signals and a set of output pins configured to provide output digital signals as a function of the input digital signals received. The circuit may also comprise a test input pin configured to receive a test input signal and a test output pin configured to provide a test output signal as a function of the test input signal received. Additionally, the circuit may comprise a set of scan registers that are selectively coupled to either the combinational circuit block or to one another so as to form a scan chain of scan registers serially coupled between the test input pin and the test output pin, the scan registers in the set of scan registers being sensitive to a clock signal.

Advantageously over the prior art, the circuit may comprise at least one input register coupled between the test input pin and a first scan register of the scan chain, the at least one input register being sensitive to an inverted replica of the clock signal received at the scan registers. Thus, the scan registers in the set of scan registers may be active on one of the rising edges or falling edges of the clock signal provided thereto, while the at least one input register may be active on the other of the rising edges or falling edges of the clock signal.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
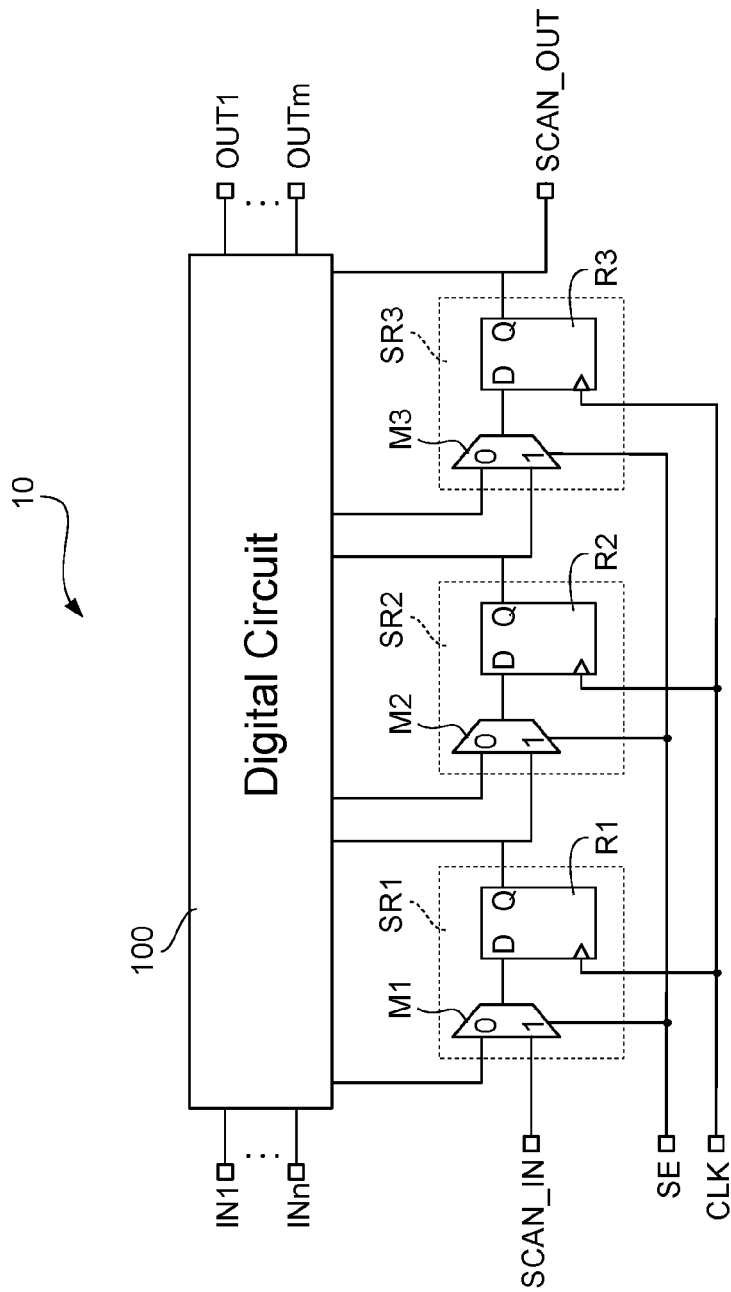
FIG. 1 is a circuit block diagram exemplary of a digital circuit suitable for ATPG scan test.

By way of introduction to the detailed description of exemplary embodiments, one may first refer to FIG. 1, which is a circuit block diagram exemplary of a digital circuit 10 suitable for ATPG scan test.

As conventional in the art, a digital circuit 10 may comprise a combinational circuit 100 and clocked memory elements (for example, registers such as flip-flops) coupled to the combinational circuit 100 in order to realize certain logic functions. The logic functions implemented by the combinational circuit 100 and the related registers transform the input signals received at the input nodes IN1, . . . , INn of the digital circuit 10 into output signals available at the output nodes OUT1, . . . , OUTm of the digital circuit 10. The number n of input nodes and m of output nodes may depend on the number and type of logic functions implemented by the combinational circuit 100.

As exemplified in FIG. 1, in case the digital circuit 10 is designed for automatic test pattern generation (ATPG) scan testing, the clocked memory elements may comprise scan registers (for example, scan flip-flops) SR1, SR2, SR3. Each of the scan registers may comprise a respective register element (for example, a flip-flop) R1, R2, R3 driven by a clock signal CLK. Each register may have its input node D coupled to the output of a respective multiplexer circuit M1, M2, M3, so that each scan register may receive input data from two alternative sources depending on the value of a scan enable signal SE which controls the multiplexer circuits M1, M2, M3.

During normal operation of the digital circuit 10, the scan enable signal SE may be set to a first logic value (for example, 0) so that the registers R1, R2, R3 are coupled to the combinational circuit 100 in order to perform the expected logic functions.

During test mode operation of the digital circuit 10, by setting the scan enable signal SE to a second logic value (for example, 1), the registers R1, R2, R3 may be coupled in series in a so-called scan chain, wherein each register receives input data directly from the output Q of a previous register in the scan chain. In the test configuration, the first scan register SR1 of the scan chain receives input data from a dedicated test input pin SCAN_IN, and the last scan register SR3 of the scan chain provides output data to a dedicated test output pin SCAN_OUT.

As conventional in the art, scan testing may be thus performed by:

setting the scan enable signal SE=1 and inserting ("shifting in" or "loading") a test vector in the scan chain through the SCAN_IN pin of the digital circuit 10, the SCAN_IN pin being coupled to the input of the first scan register SR1 of the scan chain;

after having loaded an entire test vector in the scan chain (which may involve a number of clock cycles equal to the number of registers in the chain), setting the scan enable signal SE=0, applying test input values at the input nodes IN1, . . . , INn and applying one clock pulse to the digital circuit 10, thereby updating the values stored in the registers R1, R2, R3 according to the logic functions implemented by the combinational circuit 100; and setting again the scan enable signal SE=1 and extracting ("shifting out") the resulting vector from the scan chain through the SCAN_OUT pin of the digital circuit 10, the SCAN_OUT pin being coupled to the output of the last scan register SR3 of the scan chain, and reading the values of the signals provided at the output nodes OUT1, . . . , OUTm.

While a resulting vector is being shifted out of the scan chain, a successive input test vector may be shifted in.

It will be understood that the clocked memory elements are shown as elements separated from the combinational circuit 100 for the sake of clarity only. In the real implementation of a digital circuit 10, the memory elements may be located within the same silicon area of the combinational circuit 100.

It will be understood that FIG. 1 exemplifies a digital circuit 10 comprising three scan registers SR1, SR2, SR3 for the sake of clarity and ease of illustration only. In one or more embodiments, the digital circuit 10 may comprise tens, hundreds or even more scan registers.

In one or more embodiments, the scan registers may be configured to be partitioned in a plurality of independent scan chains running scan tests in parallel, each of the scan chains having respective SCAN_IN and SCAN_OUT pins. According to one or more embodiments, appropriate design techniques may be used to reduce the number of input pins SCAN_IN (i.e., the number of input pins SCAN_IN may be lower than the number of scan chains in the circuit), while the number of SCAN_OUT pins may be equal to the number of scan chains.

Preferably, the scan chains may comprise a similar number of scan registers (for example, in case two scan chains are present, about a half of the scan registers may be connected in the first scan chain and the remaining ones may be connected in the second scan chain). Providing scan chains of similar length (for example, comprising a similar number of scan registers) may improve parallelization of the scan test, thereby reducing the test time and increasing the efficiency of the test procedure.

In order to perform a complete scan test, a plurality of test vectors may be provided sequentially at the SCAN_IN pin(s).

As conventional in the art, all the scan registers SR1, SR2, SR3 in the scan chain are configured to receive the same clock signal CLK. The scan registers SR1, SR2, SR3 may capture the value of the input at a definite portion of the clock cycle, typically at the rising edge of the clock signal CLK.

Circuits as exemplified in FIG. 1 may provide unsatisfactory test performance insofar as the scan frequency which may be adopted to run scan tests may be limited. Such a frequency limitation may be due to propagation delay(s) of the signal in the scan chain of registers R1, R2, R3 (i.e., in the internal pipelined registers) and/or delays of the clock signal received at the registers R1, R2, R3. For instance, the clock network delay of the registers R1, R2, R3 may be typically around 10 ns.

Figure 2:
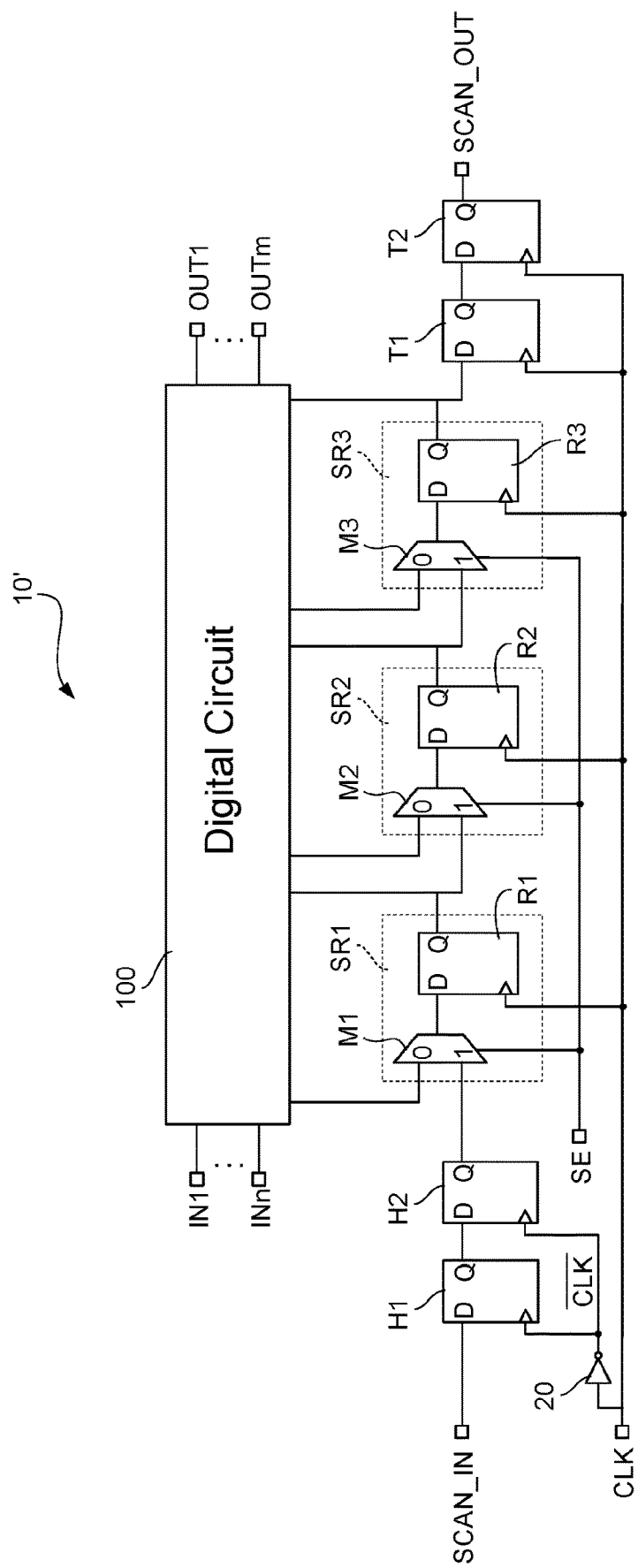
FIG. 2 is a circuit block diagram exemplary of a digital circuit suitable for ATPG scan test according to one or more embodiments.

One or more embodiments as exemplified in FIG. 2 may facilitate increasing the scan frequency during testing.

As exemplified in FIG. 2, a digital circuit 10' may comprise at least one additional "head" register (for example, a flip-flop) coupled at the beginning (for example, at the input) of the scan chain of registers SR1, SR2, SR3.

In a preferred embodiment, as exemplified in FIG. 2, the digital circuit 10' may comprise a pair of head registers H1, H2 coupled at the input of the scan chain. The input of the first head register H1 may be coupled to the SCAN_IN pin of the digital circuit 10' to receive the scan sequence(s) during a scan test phase. The input of the second head register H2 may be coupled to the output of the first head register H1. The output of the second head register H2 may be coupled to the test input (i.e., the input which is selected when SE=1, that is when the test mode is enabled) of the first scan register SR1 of the scan chain.

It is noted that implementing two head registers H1, H2 may be preferable over implementing a single head register, insofar as this may result in an improved digital layout implementation. In particular, providing a pair of head registers H1, H2 may facilitate controlling the timing margin in a clock tree network.

In one or more embodiments, the head register(s) H1, H2 may be configured to receive an inverted replica $\overline{CLK}$ of the clock signal CLK which is applied to the scan registers SR1, SR2, SR3. This may be obtained by providing an inverter gate 20 between the input pin CLK of the digital circuit 10' and the clock input(s) of the head register(s) H1, H2. Thus, the head register(s) H1, H2 may capture the value of the input at a different portion of the cycle of the clock signal CLK as compared to the scan registers SR1, SR2, SR3 (for example, the head register(s) H1, H2 may capture the value at the falling edge of the clock signal CLK).

In one or more embodiments, providing at least one head register H1/H2 driven by an inverted clock signal may facilitate increasing the timing setup margin so that the test shift clock may run faster than in the known solutions.

Additionally, a digital circuit 10' may comprise at least one additional "tail" register (for example, a flip-flop) coupled at the end (for example, at the output) of the scan chain of registers SR1, SR2, SR3.

In a preferred embodiment, as exemplified in FIG. 2, the digital circuit 10' may comprise a pair of tail registers T1, T2 coupled at the output of the scan chain. The input of the first tail register T1 may be coupled to the output of the last scan register SR3 of the scan chain. The input of the second tail register T2 may be coupled to the output of the first tail register T1. The output of the second tail register T2 may be coupled to the SCAN_OUT pin of the digital circuit 10' to provide the output scan sequence(s) during a scan test phase.

In one or more embodiments, the tail register(s) T1, T2 may be configured to receive the same clock signal CLK which is applied to the scan registers SR1, SR2, SR3. Thus, the tail register(s) T1, T2 may capture the value of the input at the same portion of the cycle of the clock signal CLK as the scan registers SR1, SR2, SR3 (for example, the tail register(s) T1, T2 may capture the value at the rising edge of the clock signal CLK).

In one or more embodiments, providing at least one tail register T1/T2 driven by the clock signal CLK may facilitate increasing the timing setup margin so that the test shift clock may run faster than in the known solutions.

Therefore, in one or more embodiments the binary values of the input test sequence may be shifted into the scan chain (at register H1) at falling edges of the clock signal CLK, while the scan registers SR1, SR2, SR3 and the tail register(s) T1, T2 may operate (for example, may capture the value of the respective input signals) at rising edges of the clock signal CLK. As a result, one or more embodiments may provide additional time margin in order to account for possible delay inside the scan chain ("pipeline"), and/or possible delay due to parasitic effects on the test board (for example, parasitic capacitance at the SCAN_OUT pin).

Therefore, one or more embodiments may comprise coupling pipeline registers H1, H2 (for example, two registers in series) between the SCAN_IN pin and the input of the first scan register SR1 of the scan chain, and coupling pipeline registers T1, T2 (for example, two registers in series) between the output of the last scan register SR3 of the scan chain and the SCAN_OUT pin, with the pipeline registers H1, H2 being driven by an inverted replica $\overline{CLK}$ of the clock signal CLK. This may provide more margin for the input delay or other (propagation) delay, and may thus facilitate increasing the shift clock frequency.

As a result, the execution speed of scan tests and/or transition fault tests may be increased (for example, the scan frequency may be doubled), thereby decreasing (for example, dividing by 2) the test time needed to provide a certain target fault coverage of logic IPs ("Intellectual Property blocks" or "Intellectual Property cores").

In one or more embodiments, the shift clock signal CLK may comprise a "pulse" at an end portion of its period. The duration of such a pulse may depend (also) on the characteristics of the Automatic Test Equipment (ATE) used for the scan test. In particular, the pulse duration may be set to a minimum width of the ATE test/design. For instance, a "return-to-zero" clock signal at 40 MHz may have a complete period of 20 ns and a high pulse lasting 9 ns. Therefore, the front low-to-high plus high-to-low may turn out to be less than 9 ns, which may entail a signal with (very) high bandwidth.

Figure 3A:
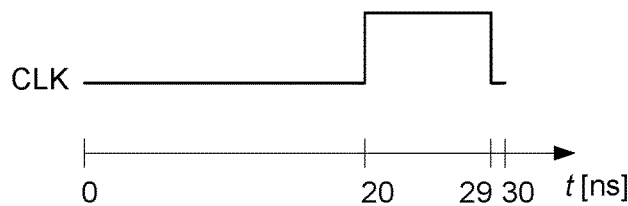
FIGS. 3A and 3B are exemplary of possible waveforms of a clock signal in one or more embodiments.
Figure 3B:
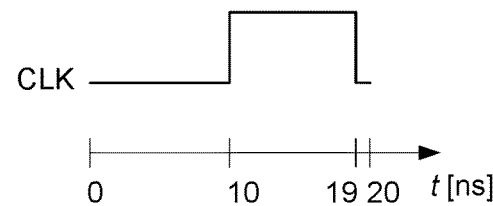

For instance, FIGS. 3A and 3B are exemplary of possible waveforms of a clock signal CLK in one or more embodiments.

FIG. 3A is exemplary of a clock signal CLK having a period of around 30 ns (1 ns=$10^{-9}$ s), corresponding to a shift frequency of approximately 33 MHz. The clock signal is low (for example, 0) between 0 ns and 20 ns, high (for example, 1) between 20 ns and 29 ns, and then returns to zero between 29 ns and 30 ns.

As exemplified in FIG. 3A, the scanIn data setup time requirement may be computed as:

clock falling edge+internal clock network delay=29 ns+10 ns=39 ns

As exemplified in FIG. 3A, the scanOut IO timing setup margin may be computed as:

$T_{shift}$-internal clock delay=30 ns-10 ns=20 ns By controlling the tail registers T1, T2 to have a smaller clock network delay, such as 5 ns, the scanOut IO timing setup margin may be increased to:

$T_{shift}$-internal clock delay=30 ns-5 ns=25 ns

FIG. 3B is exemplary of a clock signal CLK having a period of around 20 ns (1 ns=$10^{-9}$ s), corresponding to a shift frequency of approximately 50 MHz. The clock signal is low (for example, 0) between 0 ns and 10 ns, high (for example, 1) between 10 ns and 19 ns, and then returns to zero between 19 ns and 20 ns.

In one or more embodiments, the clock signal CLK may thus be a "return-to-zero" clock signal.

Figure 4A:
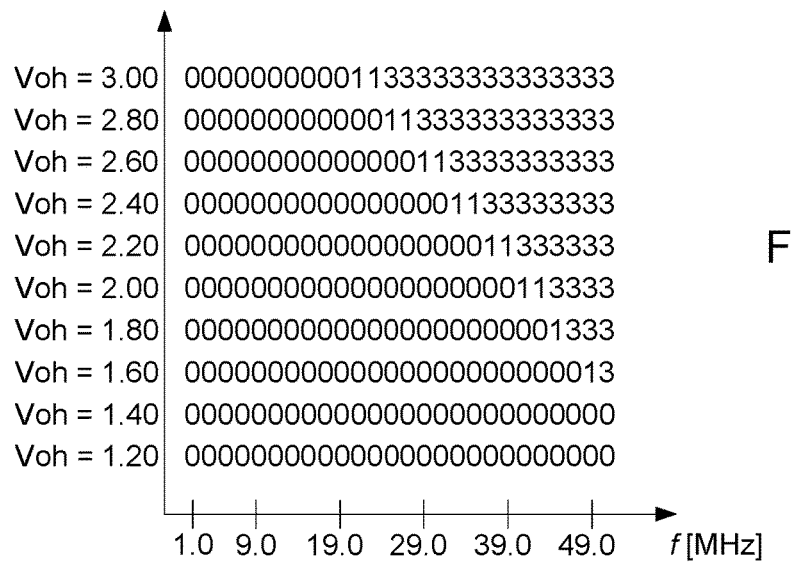
FIGS. 4A and 4B are Shmoo plots exemplary of possible results of scan tests in one or more embodiments.
Figure 4B:
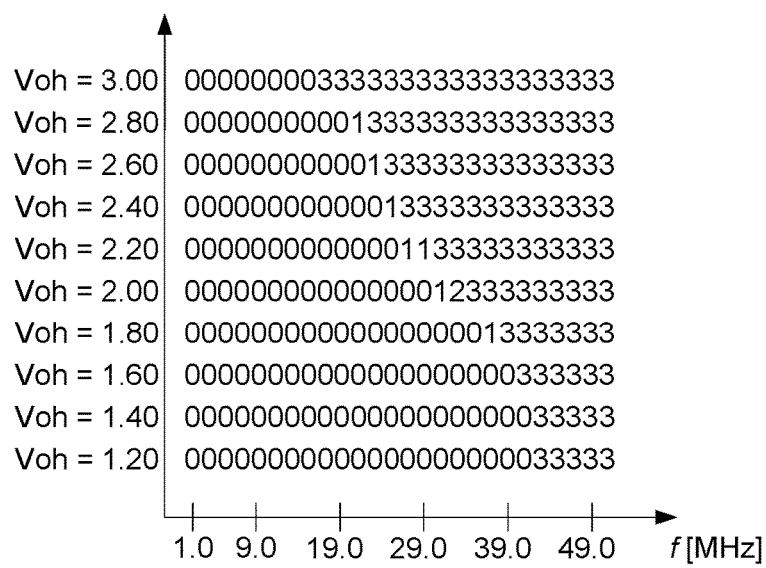

FIGS. 4A and 4B are Shmoo plots exemplary of possible results of scan tests in one or more embodiments, where values equal to 0 are indicative of successful tests and values other than 0 are indicative of unsuccessful tests.

The circuit under test is supplied with a voltage of 3.3 V. The Shmoo plots are obtained by sweeping the test frequency (i.e., the scan frequency) from 1 MHz to 50 MHz at steps of 2 MHz, and by varying the minimum output HIGH voltage Voh (i.e., the minimum value above which the output signal SCAN_OUT is considered to represent a logic one) between 1.2 V and 3.0 V at steps of 0.2 V. FIG. 4A is exemplary of a test performed on an ATE board having a parasitic capacitance of 26 pF at the SCAN_OUT pin. FIG. 4B is exemplary of a test performed on an ATE board having a parasitic capacitance of 43 pF at the SCAN_OUT pin.

As exemplified in FIG. 4A, one or more embodiments may facilitate correctly performing test of the digital circuit 10' at a scan frequency of up to 50 MHz, or possibly higher.

As exemplified herein, an electronic circuit (for example, 10') may comprise: a combinational circuit block (for example, 100) having a set of input pins (for example, IN1, ..., INn) configured to receive input digital signals and a set of output pins (for example, OUT1, ..., OUTm) configured to provide output digital signals as a function of the input digital signals received; a test input pin (for example, SCAN_IN) configured to receive a test input signal and a test output pin (for example, SCAN_OUT) configured to provide a test output signal as a function of the test input signal received; a set of scan registers (for example, SR1 SR2, SR3), wherein the scan registers in the set of scan registers are selectively (for example, SE) coupled (for example, M1, M2, M3) either to the combinational circuit block or to one another so as to form a scan chain of scan registers serially coupled between the test input pin and the test output pin, the scan registers in the set of scan registers being sensitive to a clock signal (for example, CLK); and at least one input register (for example, H1, H2) coupled between the test input pin and a first scan register (for example, SR1) of the scan chain, wherein the at least one input register is sensitive to an inverted replica (for example, 20) of the clock signal.

As exemplified herein, the scan registers in the set of scan registers may be active on one of the rising edges or falling edges of the clock signal provided thereto, and the at least one input register may be active on the other of the rising edges or falling edges of the clock signal.

As exemplified herein, the at least one input register may comprise a first input register (for example, H1) and a second input register (for example, H2) serially coupled between the test input pin and the first scan register of the scan chain. The first input register may be configured to receive test input data from the test input pin and to propagate the test input data towards the second input register, and the second input register may be configured to receive the test input data from the first input register and to propagate the test input data towards the first scan register of the scan chain.

As exemplified herein, an electronic circuit may comprise at least one output register (for example, T1, T2) coupled between a last scan register (for example, SR3) of the scan chain and the test output pin, wherein the at least one output register may be sensitive to the clock signal.

As exemplified herein, the at least one output register may comprise a first output register (for example, T1) and a second output register (for example, T2) serially coupled between the last scan register of the scan chain and the test output pin. The first output register may be configured to receive test output data from the last scan register of the scan chain and to propagate the test output data towards the second output register, and the second output register may be configured to receive the test output data from the first output register and to propagate the test output data towards the test output pin.

As exemplified herein, an electronic circuit may comprise a plurality of test input pins configured to receive respective test input signals and a plurality of test output pins configured to provide respective test output signals as a function of the test input signals received. The scan registers in the set of scan registers may be selectively couplable to one another so as to form a plurality of scan chains of scan registers serially coupled between the test input pins and the test output pins.

As exemplified herein, the scan registers in the set of scan registers may be active on rising edges of the clock signal, and the at least one input register may be active on falling edges of the clock signal.

As exemplified herein, a method of testing an electronic circuit may comprise: selectively coupling the scan registers in the set of scan register one to the other so as to form a scan chain of scan registers serially coupled between the test input pin and the test output pin of the electronic circuit; providing a test input signal at the test input pin of the electronic circuit, wherein the test input signal comprises a sequence of binary values to be shifted into the scan registers serially coupled between the test input pin and the test output pin, wherein the scan registers in the set of scan registers are active on one of the rising edges or falling edges of a clock signal; sensing a test output signal at the test output pin of the electronic circuit, wherein the test output signal comprises a sequence of binary values shifted out of the scan registers serially coupled between the test input pin and the test output pin; and operating the at least one input register active on the other of the rising edges or falling edges of the clock signal.

Without prejudice to the underlying principles, the details and embodiments may vary, even significantly, with respect to what has been described by way of example only, without departing from the extent of protection.

The extent of protection is defined by the annexed claims.

The claims are an integral part of the technical teaching provided herein in respect of the embodiments.

The invention claimed is:

1. An electronic circuit, comprising:
    a combinational circuit block having a set of input pins configured to receive input digital signals and a set of output pins configured to provide output digital signals as a function of the input digital signals received;
    a test input pin configured to receive a test input signal;
    a test output pin configured to provide a test output signal as a function of the test input signal;
    a set of scan registers, wherein the scan registers in the set of scan registers are selectively coupled to either the combinational circuit block or to one another so as to form a scan chain of scan registers serially coupled between the test input pin and the test output pin, wherein the scan registers in the set of scan registers are clocked by a clock signal; and
    at least one input register coupled between the test input pin and a first scan register of said scan chain, wherein the at least one input register is clocked by an inverted replica of said clock signal.

2. The electronic circuit of claim 1:
    wherein the scan registers in the set of scan registers are active on one of the rising edge or falling edge of said clock signal; and
    wherein said at least one input register is active on the other of the rising edge or falling edge of said clock signal.

3. The electronic circuit of claim 1, wherein said at least one input register comprises a first input register and a second input register serially coupled between the test input pin and the first scan register of said scan chain, wherein:
    the first input register is configured to receive test input data from the test input pin and to propagate said test input data towards the second input register; and
    the second input register is configured to receive said test input data from the first input register and to propagate said test input data towards the first scan register of said scan chain.

4. The electronic circuit of claim 1, further comprising at least one output register coupled between a last scan register of said scan chain and the test output pin, wherein the at least one output register is clocked by said clock signal.

5. The electronic circuit of claim 4, wherein said at least one output register comprises a first output register and a second output register serially coupled between the last scan register of said scan chain and the test output pin, wherein:
the first output register is configured to receive test output data from the last scan register of said scan chain and to propagate said test output data towards the second output register; and
the second output register is configured to receive said test output data from the first output register and to propagate said test output data towards the test output pin.

6. The electronic circuit of claim 1, further comprising a plurality of test input pins configured to receive respective test input signals and a plurality of test output pins configured to provide respective test output signals as a function of the test input signals received, wherein the scan registers in the set of scan registers are selectively coupled to one another so as to form a plurality of scan chains of scan registers serially coupled between respective test input pins and test output pins.

7. The electronic circuit of claim 1, wherein the scan registers in the set of scan registers are active on rising edges of said clock signal, and the at least one input register is active on falling edges of said clock signal.

8. A method of testing an electronic circuit, comprising:
receiving a test input signal at a test input pin of the electronic circuit, wherein the test input signal comprises a sequence of binary values;
shifting the received test input signal into at least one input register that is active on one of rising edges or falling edges of a clock signal;
shifting the received test input signal from the at least one input register into a set of scan registers serially coupled to each other to form a scan chain, wherein the set of scan registers are active on the other of rising edges or falling edges of said clock signal; and
sensing a test output signal at a test output pin of the electronic circuit, wherein the test output signal comprises a sequence of binary values shifted out of the set of scan registers forming the scan chain.

9. The method of claim 8:
wherein shifting the received test input signal from the at least one input register into the set of scan registers comprises clocking the set of scan registers with said clock signal; and
wherein shifting the received test input signal into the at least one input register comprises clocking the at least one input register with an inverted replica of said clock signal.

10. An electronic circuit, comprising:
a combinational circuit block having a set of input pins configured to receive input digital signals and a set of output pins configured to provide output digital signals as a function of the input digital signals received;
a test input pin configured to receive a test input signal;
a test output pin configured to provide a test output signal as a function of the test input signal;
a set of scan registers, wherein the scan registers in the set of scan registers are selectively coupled to either the combinational circuit block or to one another so as to form a scan chain of scan registers serially coupled between the test input pin and the test output pin;
at least one input register coupled between the test input pin and a first scan register of said scan chain;
wherein the scan registers in the set of scan registers are active on one of the rising edge or falling edge of said clock signal; and
wherein said at least one input register is active on the other of the rising edge or falling edge of said clock signal.

11. The electronic circuit of claim 10, wherein said at least one input register comprises a first input register and a second input register serially coupled between the test input pin and the first scan register of said scan chain, wherein:
the first input register is configured to receive test input data from the test input pin and to propagate said test input data towards the second input register; and
the second input register is configured to receive said test input data from the first input register and to propagate said test input data towards the first scan register of said scan chain.

12. The electronic circuit of claim 10, further comprising at least one output register coupled between a last scan register of said scan chain and the test output pin, wherein the at least one output register is active on said one of the rising edge or falling edge of said clock signal.

13. The electronic circuit of claim 12, wherein said at least one output register comprises a first output register and a second output register serially coupled between the last scan register of said scan chain and the test output pin, wherein:
the first output register is configured to receive test output data from the last scan register of said scan chain and to propagate said test output data towards the second output register; and
the second output register is configured to receive said test output data from the first output register and to propagate said test output data towards the test output pin.

* * * * *